(12) United States Patent
Gagne et al.

(10) Patent No.: US 8,536,928 B1
(45) Date of Patent: Sep. 17, 2013

(54) CONSTANT VGS CHARGE PUMP FOR LOAD SWITCH APPLICATIONS

(75) Inventors: Nickole Gagne, Saco, ME (US); Jouni Mika Kalervo Vuorinen, Oulu (FI)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/481,267

(22) Filed: May 25, 2012

(51) Int. Cl.
*H03K 17/16* (2006.01)

(52) U.S. Cl.
USPC .............................. 327/390; 327/589; 327/536

(58) Field of Classification Search
USPC ................. 327/536, 630, 534, 535, 537, 538, 327/540, 543, 545, 546, 390, 589
See application file for complete search history.

(56) References Cited

U.S. PATENT DOCUMENTS

| | | | |
|---|---|---|---|
| 5,514,994 A * | 5/1996 | Sawada .......................... | 327/390 |
| 5,801,577 A * | 9/1998 | Tailliet .......................... | 327/536 |
| 5,914,589 A * | 6/1999 | Erckert .......................... | 323/282 |
| 6,121,694 A * | 9/2000 | Thereze .......................... | 307/64 |
| 6,225,853 B1 * | 5/2001 | Matsushita .................... | 327/536 |
| 7,436,241 B2 | 10/2008 | Chen et al. | |
| 2006/0202742 A1* | 9/2006 | Aksin et al. .................... | 327/536 |
| 2012/0274362 A1* | 11/2012 | Doris et al. ..................... | 327/94 |
| 2013/0009797 A1* | 1/2013 | Grilo et al. ..................... | 341/122 |
| 2013/0049847 A1* | 2/2013 | Glibbery ........................ | 327/543 |

* cited by examiner

*Primary Examiner* — Lincoln Donovan
*Assistant Examiner* — Jung H. Kim
(74) *Attorney, Agent, or Firm* — Schwegman Lundberg & Woessner P.A.

(57) ABSTRACT

An integrated circuit (IC) comprises a transistor circuit and a voltage generator circuit. The voltage generator circuit is configured to generate an activation voltage for the transistor circuit using an output voltage at an output of the transistor circuit, and maintain a gate-source voltage ($V_{GS}$) of the transistor circuit at a substantially constant voltage above the output voltage when a magnitude of the generated activation voltage is less than a device voltage rating of the IC and when the magnitude of the generated activation voltage meets or exceeds the device voltage rating of the IC.

23 Claims, 5 Drawing Sheets

CONSTANT VGS CHARGE PUMP FOR LOAD SWITCH APPLICATIONS

BACKGROUND

An integrated circuit (IC) can receive electrical signals from off-chip electronics. Protection from excessive voltage is a concern for ICs. Typically, excessive voltage can occur due to electrostatic discharge (ESD), but excessive voltage can also occur due to inadvertent exposure of the IC to excessive supply voltages. This can result in degradation of structures within the IC.

OVERVIEW

This document relates generally to electronic systems and devices and more specifically to improving the robustness of electronic devices with integrated circuits when exposed to adverse biasing conditions.

An apparatus example includes an IC comprising a transistor circuit and a voltage generator circuit. The voltage generator circuit is configured to generate an activation voltage for the transistor circuit using an output voltage at an output of the transistor circuit, and maintain a gate-source voltage ($V_{GS}$) of the transistor circuit at a fixed or constant voltage above the output voltage when a magnitude of the generated activation voltage is less than a device voltage rating of the IC and when the magnitude of the generated activation voltage meets or exceeds the device voltage rating of the IC.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Integrated circuits can be inadvertently exposed to excessive voltages. For example, electronic devices such as cellular telephones, smart phones, and tablet or laptop computers use battery chargers to replenish device power. A failure in electronic circuits of a battery charging system could result in electronic circuits being exposed to higher voltages than intended. To protect ICs, circuits can be designed to prevent low voltage circuits from being exposed to excessive voltages.

Electronic circuits typically operate in a voltage range of zero volts (0V) to 2V, or 0V to 5V. Circuit designers typically include circuits to protect against a high voltage condition, such as by turning certain IC devices off. Sometimes the higher voltages can change operation of a device or prevent the operation of a device such as such as when an external voltage becomes too great to allow normal operation of a transistor.

For lower voltage processes, exposure to higher voltages (e.g., 6V) can stress lower voltage devices which can degrade the lifetime of an IC. Some IC designers mitigate the problem of exposure to high voltages by including high voltage tolerant devices in a circuit design. However, these types of devices can take up a large amount of IC die area leading to less efficient designs.

Figure 1:
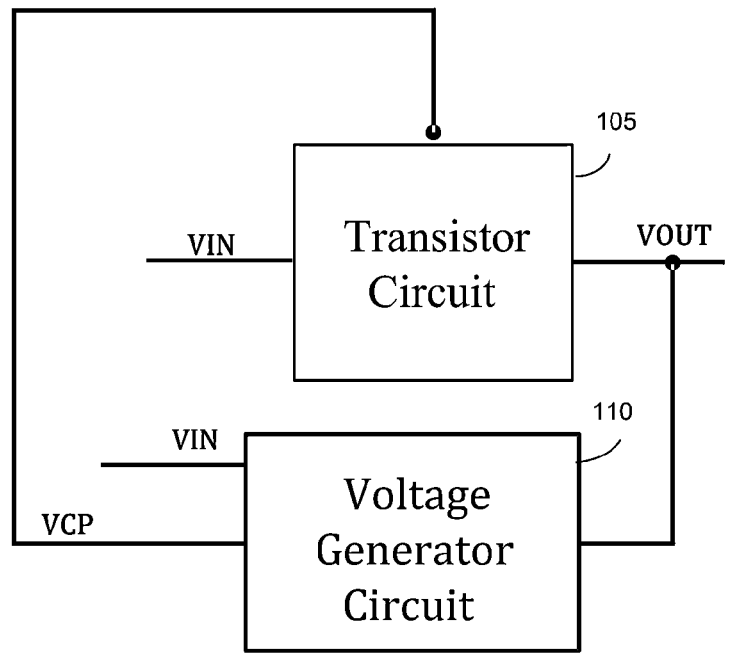
FIG. 1 is a block diagram of portions of an example of an IC to provide a device activation signal in the presence of a high voltage condition.

FIG. 1 is a block diagram of portions of an example of an IC to provide a device activation signal in the presence of a high voltage condition. The IC can be self-protecting and includes a transistor circuit 105 and a voltage generator circuit 110. The transistor circuit 105 includes at least one transistor (e.g., a metal oxide semiconductor (MOS) type transistor). In some examples, the IC is electrically coupled to a battery charging circuit. The transistor circuit 105 can include a switch circuit disposed in a circuit path configured to provide circuit power from the battery charging circuit to a peripheral device. In some examples, the peripheral device is a cellular telephone and the battery charging circuit and the IC are included in a power source for the cellular telephone.

The voltage generator circuit 110 can generate an activation voltage for the transistor circuit 105 using an output voltage at an output of the transistor circuit 105. The activation voltage may be applied to a gate of a transistor of the transistor circuit 105. The voltage generator circuit 110 can maintain a gate-source voltage ($V_{GS}$) of the transistor circuit 105 at a voltage, and in certain examples, a fixed or constant voltage, above the output voltage when a magnitude of the generated activation voltage is less than a device voltage rating of the IC and when the magnitude of the generated activation voltage meets or exceeds the device voltage rating of the IC.

For example, the voltage generator circuit 110 can generate an activation voltage that is 5.4V above the output voltage. Thus, biasing of the transistor circuit 105 allows the circuit to function even though the output voltage rises. Stated another way, the voltage generator circuit 110 generates an activation voltage that tracks the output voltage by a voltage margin that is less than the device voltage rating of the IC or of the IC manufacturing process.

In certain examples, the voltage generator circuit 110 can maintain a voltage margin in the range of 5-6V over the output voltage. If the output voltage rises to 5V and the voltage margin is substantially constant at 5.4V (e.g., within a diode or junction voltage drop of the 5.4V, or within ten percent or less of 5.4V), the activation signal can be as high as 10.4V. If the transistor circuit 105 includes an output transistor, the $V_{GS}$ at the output transistor can be 5.4 V. This allows the output transistor to still function normally at the higher voltages. The transistor circuit 105 does not require higher voltage tolerant devices because $V_{GS}$ does not exceed the voltage rating of the switch circuit 105. The voltage generator circuit may include a voltage clamp circuit attached to VIN. The voltage clamp circuit can be used to bias the transistor circuit 105 when VOUT is low.

In certain examples, the transistor circuit 105 can include one transistor. The transistor receives an input voltage at a first source-or-drain region of the transistor circuit 105, and the transistor circuit 105 generates an output voltage at a second source-or-drain region of the transistor circuit 105. The voltage margin is applied between a gate region of the transistor circuit 105 and the second source-or-drain region of the transistor circuit 105.

Figure 2:
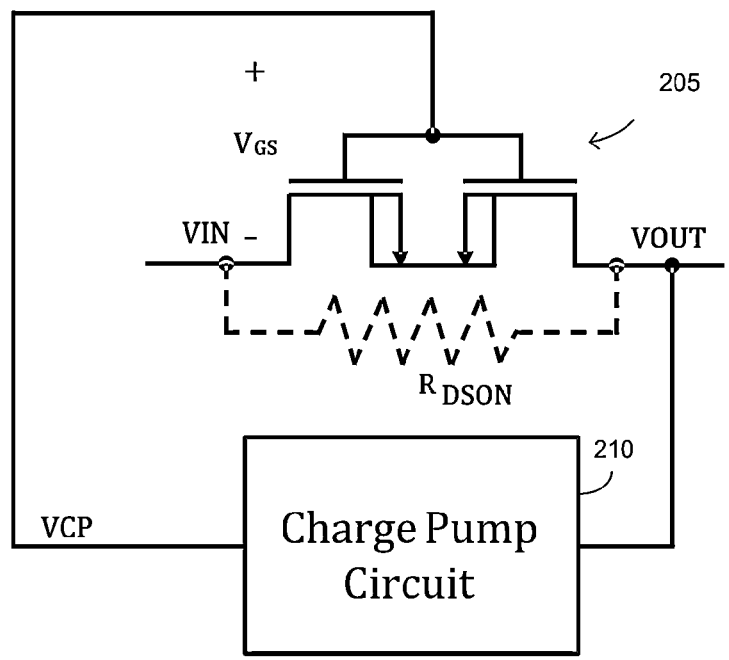
FIG. 2 is a block diagram of portions of another example of an IC to provide a device activation signal in the presence of a high voltage condition.

FIG. 2 is a block diagram of portions of another example of an IC to provide a device activation signal in the presence of a high voltage condition. In the example, the transistor circuit includes a switch circuit 205 and the voltage generator circuit includes a charge pump circuit 210. The switch circuit 205 can include two n-type MOS (NMOS) transistors with the drains connected together in series. $R_{DSON}$ represents the on-resistance of the switch circuit 205.

Figure 3:
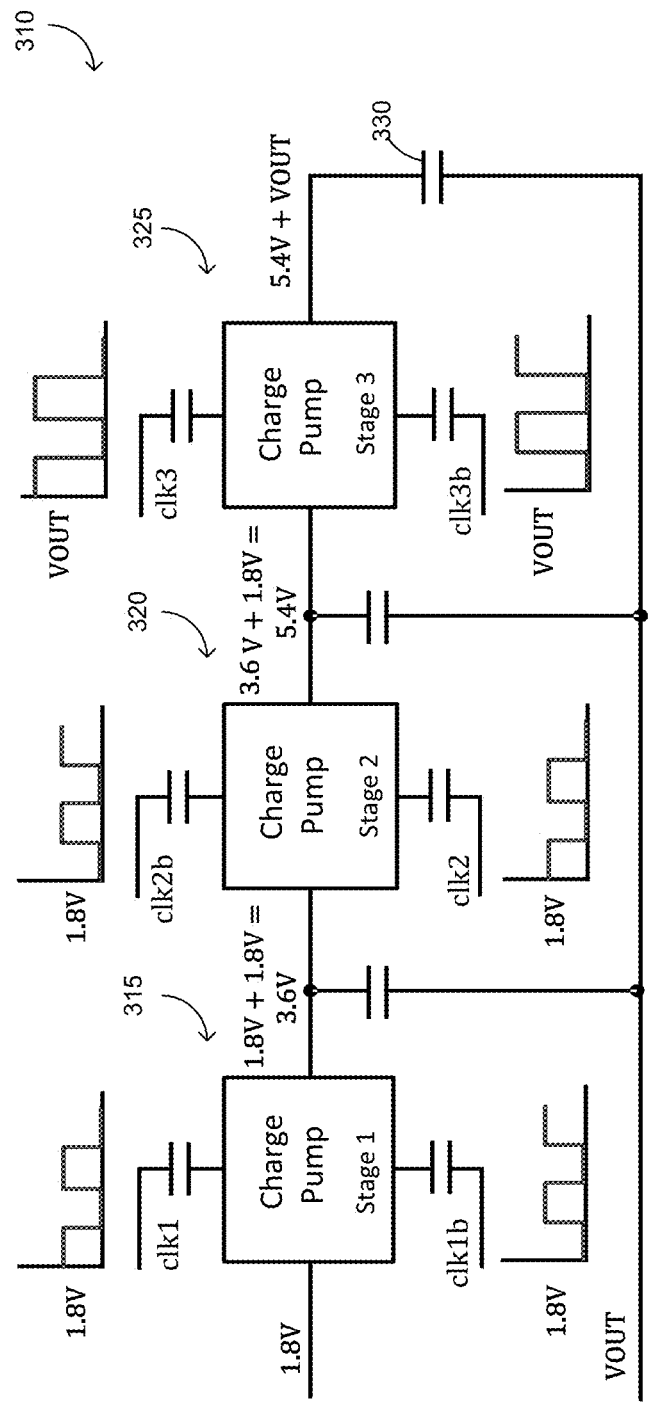
FIG. 3 shows an example of portions of an example of a charge pump circuit.

FIG. 3 shows an example of portions of an example of a charge pump circuit 310. The charge pump circuit 310 can include a plurality of stages (e.g., three stages as shown). The individual stages may use a circuit topology that adds voltages to generate a boosted voltage or may use a circuit topology that multiplies voltages to generate a boosted voltage. The first two stages can generate a boosted voltage using clock signals that are based on the supply voltage (e.g., 1.8V).

The first stage 315 can generate a boosted voltage of two times the supply voltage using the supply voltage and a clock signal based on the supply voltage (e.g., 1.8V+1.8V=3.6V). The second stage 320 can generate a boosted voltage of three times the supply voltage using the voltage generated by the first stage and a clock signal based on the supply voltage (e.g., 3.6V+1.8V=5.4V). The third stage 325, the output stage, can generate the activation voltage using the boosted voltage of the second stage and using a clock signal having a magnitude of substantially the output voltage (5.4V+VOUT). The charge pump circuit 310 can include a holding capacitor 330 at the output of the charge pump circuit that is referenced to the output voltage.

The clock signal for the output stage can be generated using the clock based on the supply voltage. For instance, the IC can include a voltage translator circuit (not shown) to translate a clock signal based on a voltage of the voltage regulated supply to the clock signal having an amplitude of VOUT. In some cases the amplitude of the VOUT clock signal may be less than VOUT by a junction diode voltage drop of the voltage translator circuit.

The charge pump circuit 310 generates an activation voltage of 5.4V+VOUT. Hence, as VOUT rises, the activation voltage applied to the switch circuit 210 of FIG. 2 will be 5.4V higher; allowing proper operation of the switch circuit. If VOUT is the output of the switch circuit 210 and the activation voltage is applied to a gate of a transistor of the switch circuit 210, the $V_{GS}$ of the transistor will remain 5.4V.

When VOUT is low, the clocks signals provided to the third stage (in the example of FIG. 3, clk3b and clk3) are low. In this case, the third stage 325 of the charge pump circuit is in a shorted state. Body diodes or parasitic diodes inherent to transistors of the third stage 325 become forward biased and short the output of the second stage 320 to the output of the charge pump circuit 310.

Figure 4:
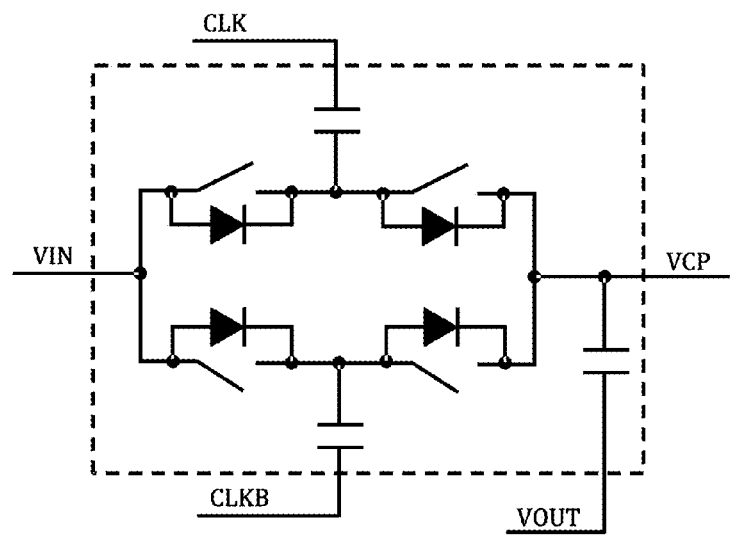
FIG. 4 shows a high-level schematic of an example of a charge pump stage circuit showing body diodes.

FIG. 4 shows a high-level schematic of an example of a charge pump stage circuit showing body diodes. Because the charge pump current draw is small, there is not much of a voltage drop through the body diodes of the third stage. Thus, the output voltage of the charge pump circuit can be substantially the boosted supply voltage from the second stage (e.g., 5.4V, or within a diode or junction voltage drop of 5.4V) when the clock signal of the output stage is low.

Figure 5:
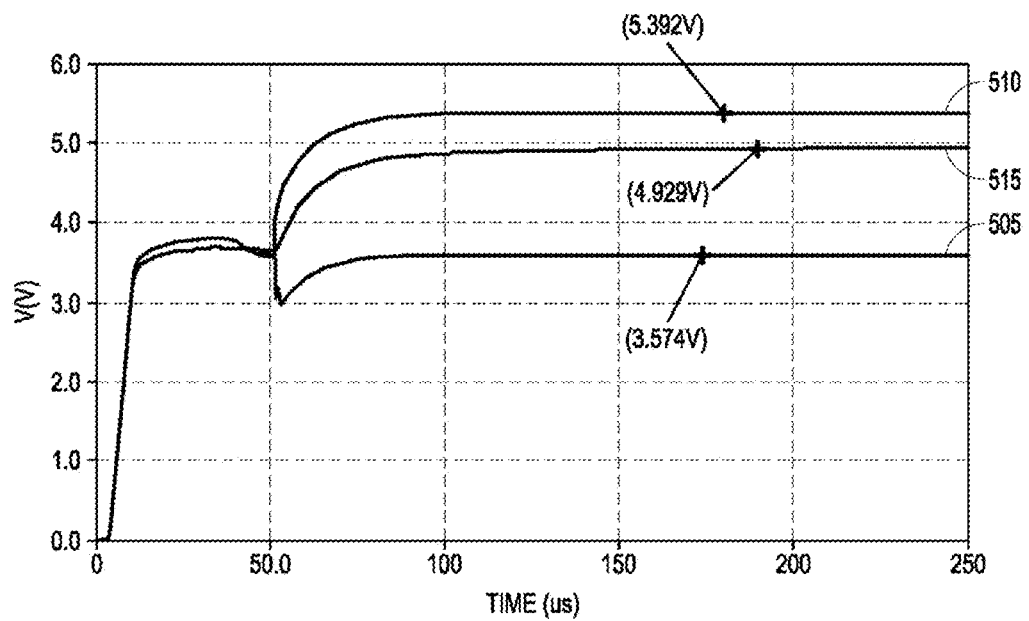
FIG. 5 shows a simulation of the example of a three stage charge pump circuit.

FIG. 5 shows a simulation of the example of a three stage charge pump circuit when VOUT is 0V. The bottom waveform 505 is the boosted voltage output of the first stage and the top waveform 510 is the boosted output of the second stage for the case where the supply voltage is 1.8V. The output of the third stage while the clock signals are 0V is shown in the middle trace 515. The charge pump output can be controlled in this way until the output stage becomes active. For the example in FIG. 3, the output stage may become active when VOUT becomes greater than a threshold voltage (VTN) of one or more transistors in the output stage.

Figure 6:
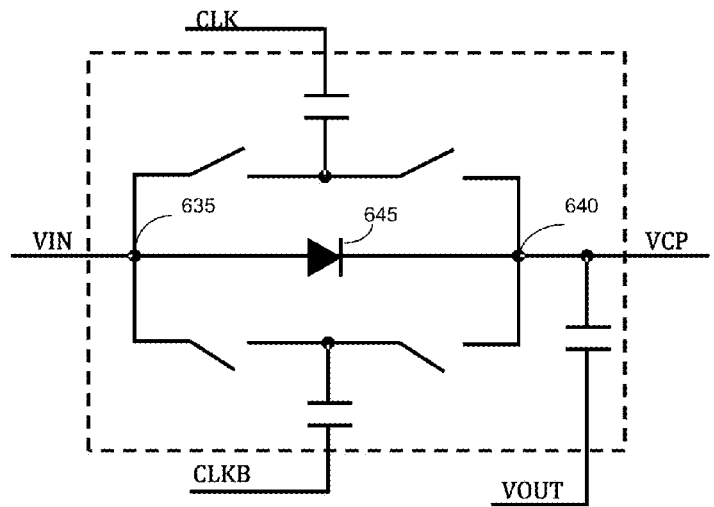
FIG. 6 shows a high-level schematic of another example of a charge pump stage circuit.

In some examples, the charge pump output stage 325 uses an external diode or diodes to control the charge pump output until the output stage becomes active. FIG. 6 shows a high-level schematic of another example of a charge pump stage. The charge pump circuit stage 625 includes an input circuit node 635 and an output circuit node 640. The charge pump circuit stage 625 can be the output stage and the activation voltage can be provided at the output circuit node. The charge pump circuit stage 625 also includes a diode 645 connected between the input circuit node 635 and the output circuit node 640.

In some examples the charge pump circuit 210 of FIG. 2 only includes one stage and the one-stage charge pump circuit generates the activation voltage using the supply voltage and using the clock signal having a magnitude of substantially VOUT. If the supply voltage is regulated to 1.8V, the generated activation voltage is 1.8V+VOUT. Although examples of a one-stage charge pump circuit and a three-stage charge pump circuit are described herein, charge pump circuits of other sizes (e.g., a six-stage charge pump circuit) may be useful.

As explained previously herein, the charge pump circuit 210 maintains a constant $V_{GS}$ at the switch circuit 205 even though the magnitude of the activation voltage exceeds the device voltage rating of the IC. This maintains the on resistance of the switch circuit 205 substantially constant (e.g., ±10%) as the input voltage increases. For charge pump circuits that generate a voltage referenced to ground, the on resistance increases as the switch voltage increases.

Figure 7:
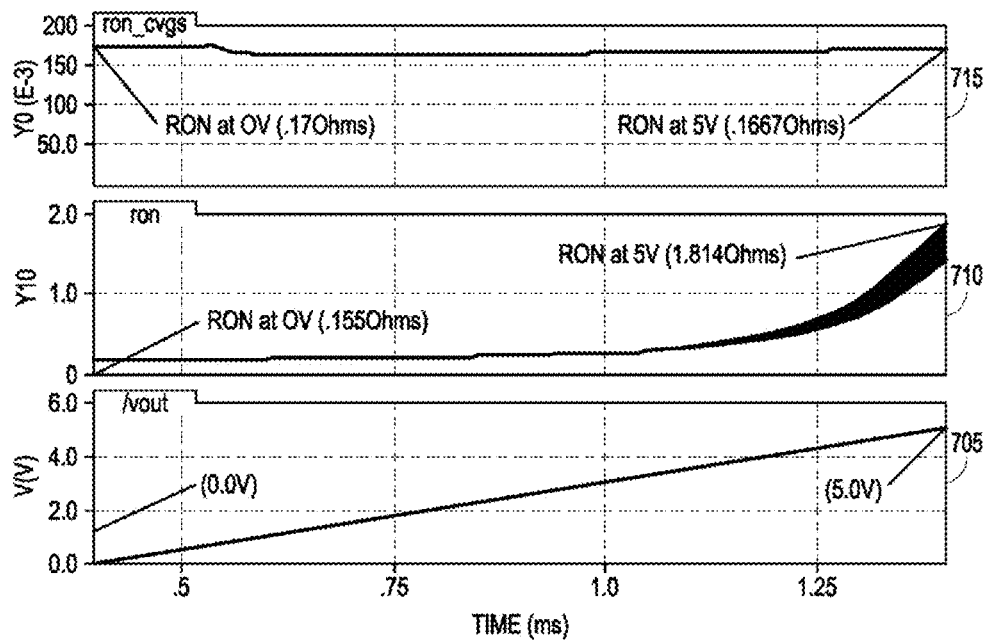
FIG. 7 shows an example of a simulation of a switch circuit.

FIG. 7 shows an example of a simulation of a switch circuit driven with a voltage referenced to ground and with a voltage referenced to the output. Graph 705 shows VOUT increasing. Graph 710 shows a simulation of the on resistance RON of a switch circuit example activated with a voltage referenced to ground. It can be seen from the graph that RON is increasing as VOUT is increasing. Graph 715 shows a simulation of the on resistance of the switch circuit example with a voltage referenced to the output to provide a constant $V_{GS}$. It can be seen from the graph that RON is substantially constant as the output voltage increases.

Thus, using a constant $V_{GS}$ at the switch circuit 205 of FIG. 2 using the charge pump circuit 210 maintains a defined amount of drive voltage at the switch regardless of the magnitude of the activation voltage. This approach allows operation of the switch circuit as the voltage of the switch rises without the need for high voltage tolerant devices.

Figure 8:
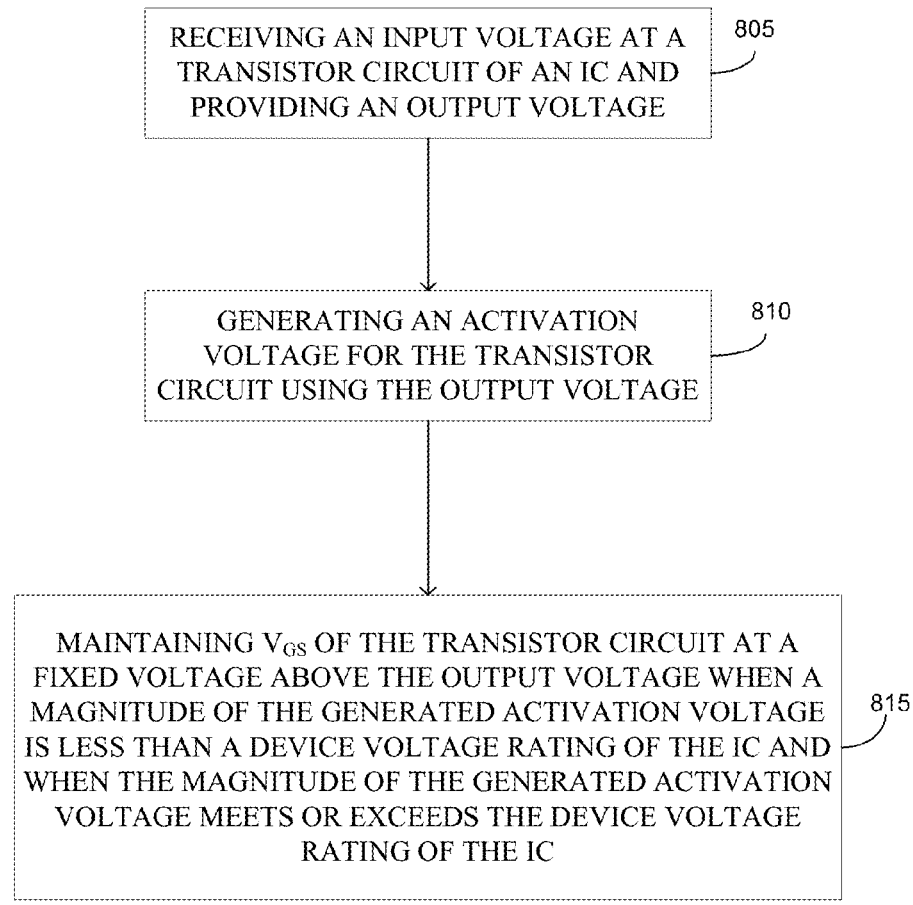
FIG. 8 is a flow diagram of a method of providing a device activation signal to an IC device.

FIG. 8 is a flow diagram of a method 800 of providing a device activation signal to an IC device in the presence of a high voltage condition. At block 805, an input voltage is received at a transistor circuit of an IC and an output voltage is provided at the output of the transistor circuit.

At block 810, an activation voltage is generated for the transistor circuit using the output voltage. At block 815, a gate-source voltage ($V_{GS}$) of the transistor circuit is maintained at a fixed or constant voltage above the output voltage when a magnitude of the generated activation voltage is less than a device voltage rating of the IC and when the magnitude of the generated activation voltage meets or exceeds the device voltage rating of the IC.

Additional Notes and Examples

Example 1 includes subject matter (such as an apparatus) comprising a self-protecting IC. The IC includes a transistor circuit and a voltage generator circuit. The voltage generator circuit is configured to generate an activation voltage for the transistor circuit using an output voltage at an output of the transistor circuit and maintain a gate-source voltage ($V_{GS}$) of the transistor circuit at a substantially constant voltage above the output voltage when a magnitude of the generated activation voltage is less than a device voltage rating of the IC and when the magnitude of the generated activation voltage meets or exceeds the device voltage rating of the IC.

In Example 2, the subject matter of Example 1 can optionally include a voltage generator circuit configured to generate the activation voltage to track the output voltage by a voltage margin that is less than the device voltage rating of the IC.

In Example 3, the subject matter of one or any combination of Examples 1 and 2 can optionally include a transistor circuit that includes a switch circuit, and the $V_{GS}$ can optionally be applied to at least one gate region of a transistor.

In Example 4, the subject matter of one or any combination of Examples 1-3 can optionally include a transistor circuit that includes a switch circuit, and the switch circuit can optionally include two NMOS type transistors serially connected between the input and the output.

In Example 5, the subject matter of one or any combination of Examples 1-4 can optionally include a voltage generator circuit that includes a charge pump circuit configured to generate the activation voltage using a clock signal having a magnitude of substantially the output voltage.

In Example 6, the subject matter of Example 5 can optionally include a charge pump circuit that includes a holding capacitor at the output of the charge pump circuit that is referenced to the output voltage.

In Example 7, the subject matter of one or any combination of Examples 5 and 6 can optionally include a plurality of charge pumping circuit stages including an output stage, wherein the output stage of the charge pumping circuit is configured to generate the activation voltage using the clock signal having a magnitude of substantially the output voltage.

In Example 8, the subject matter of one or any combination of Examples 5-7 can optionally include a charge pumping stage prior to the output stage that can optionally be configured to provide a voltage boosted from a supply voltage of the IC, and the output voltage is substantially the boosted supply voltage when the clock signal of the output stage is low.

In Example 9, the subject matter of one or any combination of Examples 5-8 can optionally include a charge pump circuit that includes an input circuit node, an output circuit node, and a diode connected between the input circuit node and the output circuit node. The activation voltage can optionally be provided at the output circuit node.

Example 10 includes subject matter (such as a system), or can optionally be combined with the subject matter of one or any combination of Examples 1-7 to include such subject matter comprising a battery charging circuit and an IC. The IC includes an input electrically coupled to the battery charging circuit, a transistor circuit having an output transistor, and a voltage generator circuit. The voltage generator circuit is configured to generate an activation voltage for the transistor circuit using an output voltage at an output of the transistor circuit, and maintain a gate-source voltage ($V_{GS}$) of the transistor circuit at a substantially constant voltage above the output voltage when a magnitude of the generated activation voltage is less than a device voltage rating of the IC and when the magnitude of the generated activation voltage meets or exceeds the device voltage rating of the IC.

In Example 11, the subject matter of Example 10 can optionally include a transistor circuit that includes a switch circuit disposed in a circuit path configured to provide circuit power from the battery charging circuit to a peripheral device.

In Example 12, the subject matter of one or any combination of Examples 10 and 11 can optionally include a transistor circuit that includes a switch circuit that includes two NMOS type transistors serially connected between the input and the output, and wherein the $V_{GS}$ is applied to gate regions of the NMOS type transistors.

In Example 13, the subject matter of one or any combination of Examples 10-12 can optionally include a voltage generator circuit that includes a charge pump circuit configured to generate the activation voltage using a clock signal having a magnitude of substantially the output voltage.

In Example 14, the subject matter of Example 13 can optionally include a charge pump circuit that includes a holding capacitor at the output of the charge pump circuit that is referenced to the output voltage.

In Example 15, the subject matter of one or any combination of Examples 1-14 can optionally include the system being included in a power source for a cellular telephone.

Example 16 can include subject matter (such as a method, a means for performing acts, or a machine-readable medium including instructions that, when performed by the machine, cause the machine to perform acts), or can optionally be combined with the subject matter of one or any combination of Examples 1-10 to include such subject matter comprising receiving an input voltage at a transistor circuit of an IC and providing an output voltage, generating an activation voltage for the transistor circuit using the output voltage, and maintaining a gate-source voltage ($V_{GS}$) of the transistor circuit at a substantially constant voltage above the output voltage when a magnitude of the generated activation voltage is less than a device voltage rating of the IC and when the magnitude of the generated activation voltage meets or exceeds the device voltage rating of the IC.

In Example 17, the subject matter of Example 16 can optionally include receiving the input voltage at an input to a switch circuit of the IC.

In Example 18, the subject matter of Example 17 can optionally include maintaining an on-resistance of the switch circuit substantially constant as the input voltage increases.

In Example 19, the subject matter of one or any combination of Examples 16-18 can optionally include generating the activation voltage to track an output voltage of the transistor circuit by a voltage margin that is less than the device voltage rating of the IC.

In Example 20, the subject matter of one or any combination of Examples 10-19 can optionally include receiving the input voltage at a first source-or-drain region of the transistor circuit and generating the output voltage at a second source-or-drain region of the transistor circuit. The voltage margin can optionally be applied between a gate region of the transistor circuit and the second source-or-drain region of the transistor circuit.

In Example 21, the subject matter of one or any combination of Examples 16-20 can optionally include generating the activation voltage using a charge pump circuit. The charge pump circuit can optionally generate the activation voltage using a clock signal having a magnitude of substantially the output voltage.

In Example 22, the subject matter of one or any combination of Examples 16-21 can optionally include generating the activation voltage using a charge pump circuit, wherein a holding capacitor at the output of the charge pump circuit is referenced to the output voltage.

In Example 23, the subject matter of one or any combination of Examples 16-22 can optionally include generating the activation voltage using a charge pump circuit having a plurality of charge pumping stages including an output stage. The output stage of the charge pumping circuit can optionally generate the activation voltage using the clock signal having a magnitude of substantially the output voltage.

Example 24 can include, or can optionally be combined with any portion or combination of any portions of any one or more of Examples 1-23 to include, subject matter that can include means for performing any one or more of the functions of Examples 1-23, or a machine-readable medium including instructions that, when performed by a machine, cause the machine to perform any one or more of the functions of Examples 1-23.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile computer-readable media during execution or at other times. These computer-readable media can include, but are not limited to, hard disks, removable magnetic disks, removable optical disks (e.g., compact disks and digital video disks), magnetic cassettes, memory cards or sticks, random access memories (RAM's), read only memories (ROM's), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A self-protecting integrated circuit (IC) comprising:
   a transistor circuit; and
   a voltage generator circuit configured to:
      generate an activation voltage for the transistor circuit using an output voltage at an output of the transistor circuit; and
      maintain a gate-source voltage ($V_{GS}$) of the transistor circuit at a substantially constant voltage above the output voltage when a magnitude of the generated activation voltage is less than or meets a device voltage rating of the IC, and when the magnitude of the generated activation voltage exceeds the device voltage rating of the IC, wherein the voltage generator circuit includes a charge pump circuit configured to generate the activation voltage using a clock signal having a high voltage level constantly equal to the output voltage at the output of the transistor circuit.

2. The IC of claim 1, wherein the voltage generator circuit is configured to generate the activation voltage to track the output voltage by a voltage margin that is less than the device voltage rating of the IC.

3. The IC of claim 1, wherein the transistor circuit includes a switch circuit and the $V_{GS}$ is applied to at least one gate region of a transistor.

4. The IC of claim 3, wherein the switch circuit includes an input, an output, and two NMOS type transistors serially connected between the input and the output.

5. The IC of claim 1, wherein the charge pump circuit is configured to generate the activation voltage using a clock signal having a magnitude of substantially the output voltage.

6. The IC of claim 5, wherein the charge pump circuit includes a holding capacitor at the output of the charge pump circuit that is referenced to the output voltage.

7. The IC of claim 5, wherein the charge pump circuit includes a plurality of charge pumping circuit stages including an output stage, wherein the output stage of the charge pumping circuit is configured to generate the activation voltage using the clock signal having a magnitude of substantially the output voltage.

8. The IC of claim 7, wherein a charge pumping stage prior to the output stage is configured to provide a voltage boosted from a supply voltage of the IC, and the output voltage is substantially the boosted supply voltage when the clock signal of the output stage is low.

9. The IC of claim 5, wherein the charge pump circuit includes:
an input circuit node and an output circuit node, wherein the activation voltage is provided at the output circuit node; and
a diode connected between the input circuit node and the output circuit node.

10. A system comprising:
a battery charging circuit; and
an IC including:
an input electrically coupled to the battery charging circuit;
a transistor circuit having an output transistor; and
a voltage generator circuit configured to:
generate an activation voltage for the transistor circuit using an output voltage at an output of the transistor circuit; and
maintain a gate-source voltage ($V_{GS}$) of the transistor circuit at a substantially constant voltage above the output voltage when a magnitude of the generated activation voltage is less than or meets a device voltage rating of the IC and when the magnitude of the generated activation voltage exceeds the device voltage rating of the IC, wherein the voltage generator circuit includes a charge pump circuit configured to generate the activation voltage using a clock signal having a high voltage level constantly equal to the output voltage at the output of the transistor circuit.

11. The system of claim 10, wherein the transistor circuit includes a switch circuit disposed in a circuit path configured to provide circuit power from the battery charging circuit to a peripheral device.

12. The system of claim 11, wherein the switch circuit includes an input, an output, and two NMOS type transistors serially connected between the input and the output, and wherein the $V_{GS}$ is applied to gate regions of the NMOS type transistors.

13. The system of claim 10, wherein the charge pump circuit is configured to generate the activation voltage using a clock signal having a magnitude of substantially the output voltage.

14. The system of claim 13, wherein the charge pump circuit includes a holding capacitor at the output of the charge pump circuit that is referenced to the output voltage.

15. The system of claim 10, wherein the system is included in a power source for a cellular telephone.

16. A method comprising:
receiving an input voltage at a transistor circuit of an IC and providing an output voltage of the transistor;
generating an activation voltage for the transistor circuit using a charge pump circuit wherein the charge pump circuit generates the activation voltage using a clock signal having a high voltage level constantly equal to the output voltage at the output of the transistor circuit; and
maintaining a gate-source voltage ($V_{GS}$) of the transistor circuit at a substantially constant voltage above the output voltage when a magnitude of the generated activation voltage is less than or meets a device voltage rating of the IC and when the magnitude of the generated activation voltage exceeds the device voltage rating of the IC.

17. The method of claim 16, wherein receiving an input voltage at a transistor circuit includes receiving the input voltage at an input to a switch circuit of the IC.

18. The method of claim 17, including maintaining an on-resistance of the switch circuit substantially constant as the input voltage increases.

19. The method of claim 16, wherein generating the activation voltage includes generating the activation voltage to track an output voltage of the transistor circuit by a voltage margin that is less than the device voltage rating of the IC.

20. The method of claim 19,
wherein receiving an input voltage at a transistor circuit includes receiving the input voltage at a first source-or-drain region of the transistor circuit,
wherein providing the output voltage includes generating the output voltage at a second source-or-drain region of the transistor circuit, and
wherein the voltage margin is applied between a gate region of the transistor circuit and the second source-or-drain region of the transistor circuit.

21. The method of claim 16, wherein generating an activation voltage includes generates the activation voltage using a clock signal having a magnitude of substantially the output voltage.

22. The method of claim 21, wherein generating an activation voltage includes generating the activation voltage using a charge pump circuit, wherein a holding capacitor at the output of the charge pump circuit is referenced to the output voltage.

23. The method of claim 21, wherein generating the activation voltage includes generating the activation voltage using a charge pump circuit having a plurality of charge pumping stages including an output stage, and
wherein the output stage of the charge pumping circuit generates the activation voltage using the clock signal having a magnitude of substantially the output voltage.

* * * * *